(12) United States Patent
Kosuga et al.

(10) Patent No.: US 10,660,216 B1
(45) Date of Patent: *May 19, 2020

(54) METHOD OF MANUFACTURING ELECTRONIC BOARD AND MOUNTING SHEET

(71) Applicant: LENOVO (SINGAPORE) PTE. LTD., Singapore (SG)

(72) Inventors: Tadashi Kosuga, Yokohama (JP); Tin-Lup Wong, Morrisville, NC (US)

(73) Assignee: LENOVO (SINGAPORE) PTE. LTD., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 16/244,530

(22) Filed: Jan. 10, 2019

Related U.S. Application Data

(60) Provisional application No. 62/768,973, filed on Nov. 18, 2018.

(51) Int. Cl.
*B23K 1/00* (2006.01)
*H05K 3/34* (2006.01)
*H05K 3/30* (2006.01)

(52) U.S. Cl.
CPC ........... *H05K 3/3494* (2013.01); *H05K 3/301* (2013.01); *H05K 3/3421* (2013.01); *H05K 2203/0465* (2013.01)

(58) Field of Classification Search
CPC ..................... B23K 1/0016; B23K 2101/40
See application file for complete search history.

(56) References Cited

U.S. PATENT DOCUMENTS

| | | | | |
|---|---|---|---|---|
| 2011/0266030 A1* | 11/2011 | Swaminathan | ........ | B82Y 25/00 174/126.2 |
| 2011/0315429 A1* | 12/2011 | Chen | ........ | H01L 24/11 174/126.2 |
| 2013/0236724 A1* | 9/2013 | Yamamoto | ........ | C09J 7/38 428/349 |
| 2013/0335880 A1* | 12/2013 | Masuda | ........ | H01G 4/005 361/303 |
| 2016/0057861 A1* | 2/2016 | Berge | ........ | B23K 1/0016 361/767 |

FOREIGN PATENT DOCUMENTS

| | | |
|---|---|---|
| JP | 2001024029 A | 1/2001 |
| JP | 2004247393 A | 9/2004 |
| JP | 2007059600 A | 3/2007 |
| JP | 2007258489 A | 10/2007 |
| JP | 2011119731 A | 6/2011 |
| JP | 2016184612 A | 10/2016 |
| WO | 2016017076 A1 | 4/2017 |

* cited by examiner

*Primary Examiner* — Erin B Saad
(74) *Attorney, Agent, or Firm* — Shimokaji IP

(57) ABSTRACT

A method of manufacturing an electronic board includes: preparing a substrate in which substrate-side solder parts are provided on electrodes; preparing a mounting sheet having a resin layer in which a plurality of voids is formed in accordance with positions of the electrodes; attaching the resin layer to at least one of a first electronic component and the substrate so that interfaces of the first electronic component or the substrate-side solder parts are located inside the respective voids; causing the interfaces and the substrate-side solder parts to face each other at positions of the respective voids; and melting the substrate-side solder parts by heating to join the interfaces and the electrodes.

6 Claims, 14 Drawing Sheets

METHOD OF MANUFACTURING ELECTRONIC BOARD AND MOUNTING SHEET

FIELD OF THE INVENTION

The present invention relates to a method of manufacturing an electronic board and a mounting sheet.

BACKGROUND OF THE INVENTION

Conventionally, as disclosed in Japanese Unexamined Patent Application Publication No. 2007-59600, a method of mounting electronic components on a substrate by using solder has been performed. Moreover, in order to reinforce solder joints between electronic components and a substrate or a printed circuit board, there has been performed a method of filling up resin materials between the electronic components and the substrate (underfill/encapsulation) or a method of partially applying resin materials to the corners etc. of the electronic components (corner bond/corner fill).

The conventional method has a possibility that the solder joints between the electronic components and the substrate cannot be efficiently and certainly reinforced by using resin materials.

The present invention has been achieved in view of the above problem, and an object of the invention is to provide a method that can efficiently and certainly reinforce a solder joint between an electronic component and a substrate by using a resin material.

SUMMARY OF THE INVENTION

To solve the problem, a method of manufacturing an electronic board according to the first aspect of the present invention includes: preparing a substrate in which substrate-side solder parts are provided on electrodes; preparing a mounting sheet having a resin layer in which a plurality of voids is formed in accordance with positions of the electrodes; attaching the resin layer to at least one of a first electronic component and the substrate so that interfaces of the first electronic component or the substrate-side solder parts are located inside the respective voids; causing the interfaces and the substrate-side solder parts to face each other at positions of the respective voids; and melting the substrate-side solder parts by heating to join the interfaces and the electrodes.

Moreover, a mounting sheet according to the second aspect of the present invention is used for mounting an electronic component on a substrate, the mounting sheet including a resin layer in which a plurality of voids is formed in accordance with positions of electrodes of the substrate to be mounted, wherein the voids penetrate through the resin layer in a thickness direction of the resin layer.

Effects of the Invention

The above-described aspects of the present invention can efficiently and certainly reinforce a solder joint between an electronic component and a substrate by using a resin material.

DETAILED DESCRIPTION OF THE INVENTION

First Embodiment

Hereinafter, a method of manufacturing an electronic board (mounting board) and a mounting sheet used in the manufacturing method according to the first embodiment will be explained with reference to the drawings.

Figure 1:
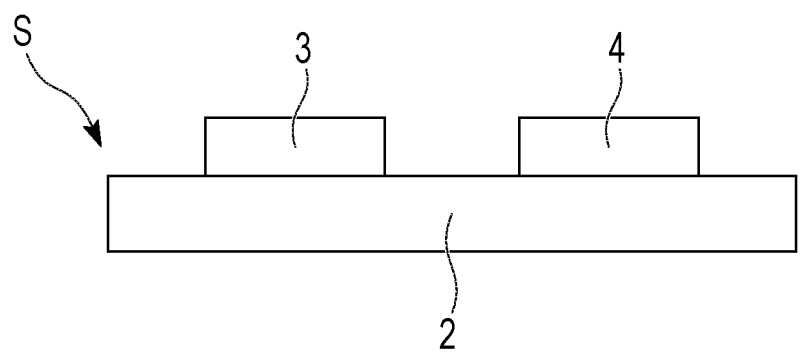
FIG. 1 is a schematic diagram illustrating an electronic board obtained by a method of manufacturing the electronic board according to a first embodiment.

The method of manufacturing the electronic board according to the present embodiment can manufacture an electronic board S as illustrated in FIG. 1, for example. The electronic board S includes a substrate 2 and first and second electronic components 3 and 4 mounted on the substrate 2. The substrate 2 includes a substrate body 2a formed of insulating materials and electrodes 2b formed of electric conductors (see FIG. 3A). The first electronic component 3 and the second electronic component 4 have interfaces electrically connected to the electrodes 2b.

The first electronic component 3 and the second electronic component 4 can employ IC (Integrated Circuit) chip such as LSI (Large Scale Integration) and SSI (Small Scale Integration). Particularly, the first electronic component 3 may employ relatively expensive components such as CPU (Central Processing Unit), GPU (Graphic Processing Unit), memory, and SSD (Solid State Drive), and the second electronic component 4 may employ the other components. The reason will be described later.

The first electronic component 3 and the second electronic component 4 are mounted on the substrate 2 by using reflow soldering. In the present specification, "%" on solder alloy composition is "mass %" unless otherwise specified.

In addition, the electronic board S may not include the second electronic component 4. Alternatively, the electronic board S may include a plurality of the first electronic components 3 or a plurality of the second electronic components 4.

Figure 2A:
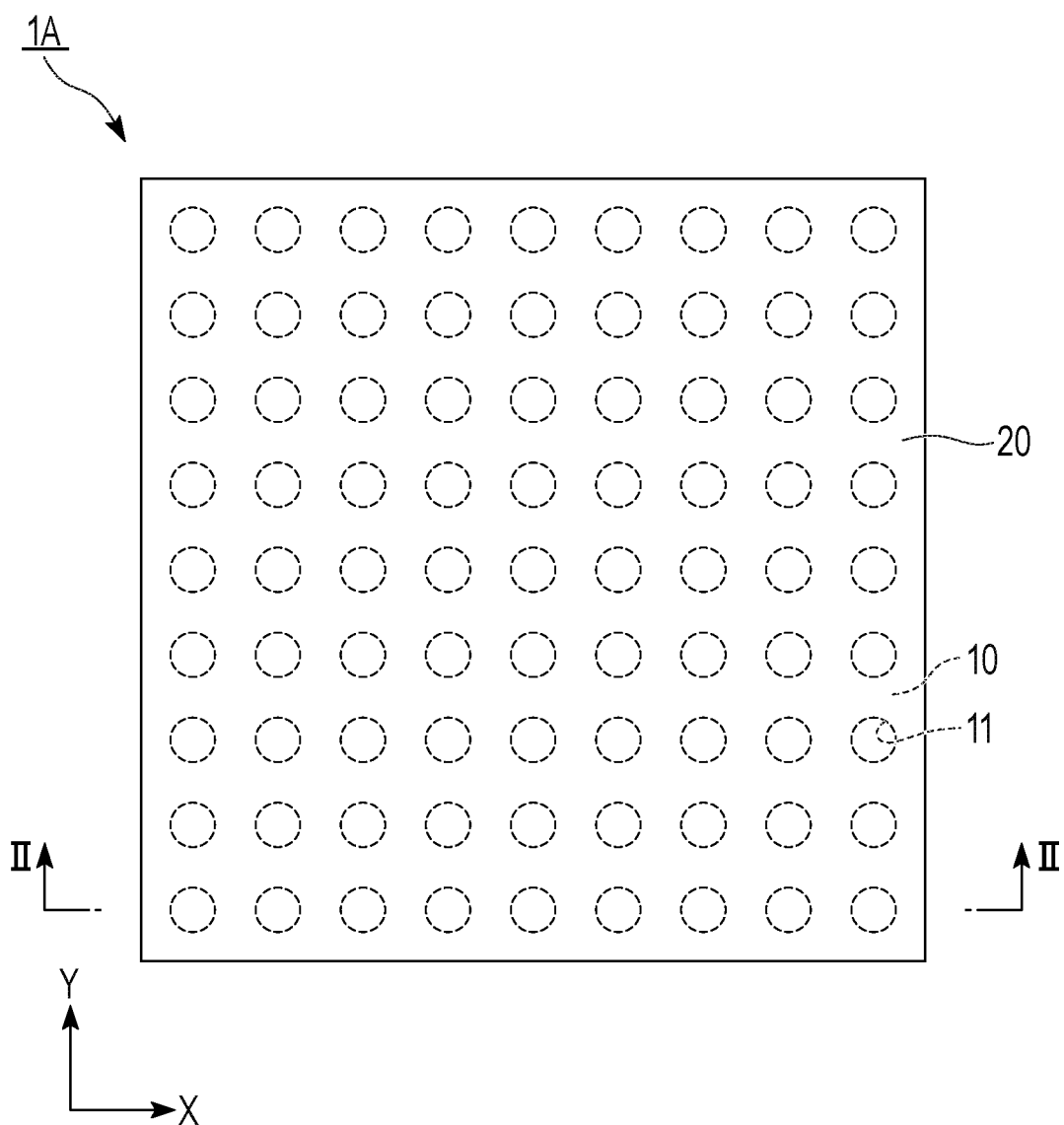
FIG. 2A is a plan view illustrating a mounting sheet according to the first embodiment.
Figure 2B:
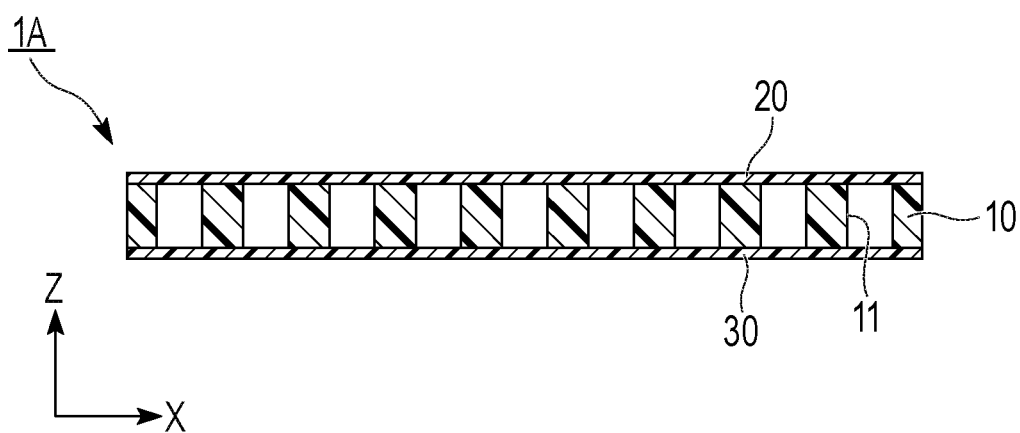
FIG. 2B is a cross-sectional diagram taken along II-II arrows in FIG. 2A.

FIGS. 2A and 2B illustrate an example of a mounting sheet 1A used in the method of manufacturing the electronic board according to the present embodiment. The mounting sheet 1A includes a resin layer 10 formed of resin, a first cover film 20 that covers a top surface of the resin layer 10, and a second cover film 30 that covers a bottom surface of the resin layer 10.

Definition of Direction

In the present embodiment, the thickness direction of the resin layer 10 indicates a vertical direction Z. One direction perpendicular to the vertical direction Z indicates a horizontal direction X and a direction perpendicular to both directions of the vertical direction Z and the horizontal direction X indicates a front-back direction Y. Along the vertical direction Z, the substrate 2 side and the first-electronic-component 3 side of the resin layer respectively mean the lower and upper sides. Moreover, a planar view means to view a target object from the vertical direction Z.

The resin layer 10 is a part that acts as the underfill of the first electronic component 3 in the electronic board S. The resin layer 10 can use resin materials (composite resin) including epoxy resin, acrylic resin, silicon resin, etc. In order to improve various resistances such as durability and heat resistance, a filler such as glass may be added to the resin materials of the resin layer 10. The resin layer 10 may have an adherence property. In this regard, however, the specific material, composition, and property of the resin layer 10 are not limited to the above and thus can be appropriately changed.

As illustrated in FIG. 2A, the resin layer 10 is formed in a square shape in a planar view. The outer shape of the resin layer 10 can be appropriately changed. However, it is preferable that the outer shape has a shape tailored to a main body 3a (see FIG. 3A) of the first electronic component 3. That is to say, if the main body 3a of the first electronic component 3 has a square shape in a planar view, the resin layer 10 may have a square shape as illustrated in FIG. 2A. Alternatively, if the main body 3a of the first electronic component 3 has a rectangular shape in a planar view, the resin layer 10 may have a rectangular shape.

A plurality of voids 11 is formed in the resin layer 10. In the example of FIGS. 2A and 2B, each of the voids 11 is a cylindrical through-hole and penetrates through the resin layer 10 in the vertical direction Z. For this reason, the voids 11 are open toward both upward and downward directions. In this regard, however, the shape of the voids 11 may be appropriately changed in accordance with interfaces 3b of the first electronic component 3 or substrate-side solder parts 2c (described later) of the substrate 2.

In the example of FIGS. 2A and 2B, the voids 11 are arranged at intervals in the horizontal direction X and the front-back direction Y. In other words, the voids 11 are arranged in a grid pattern.

Figure 3A:
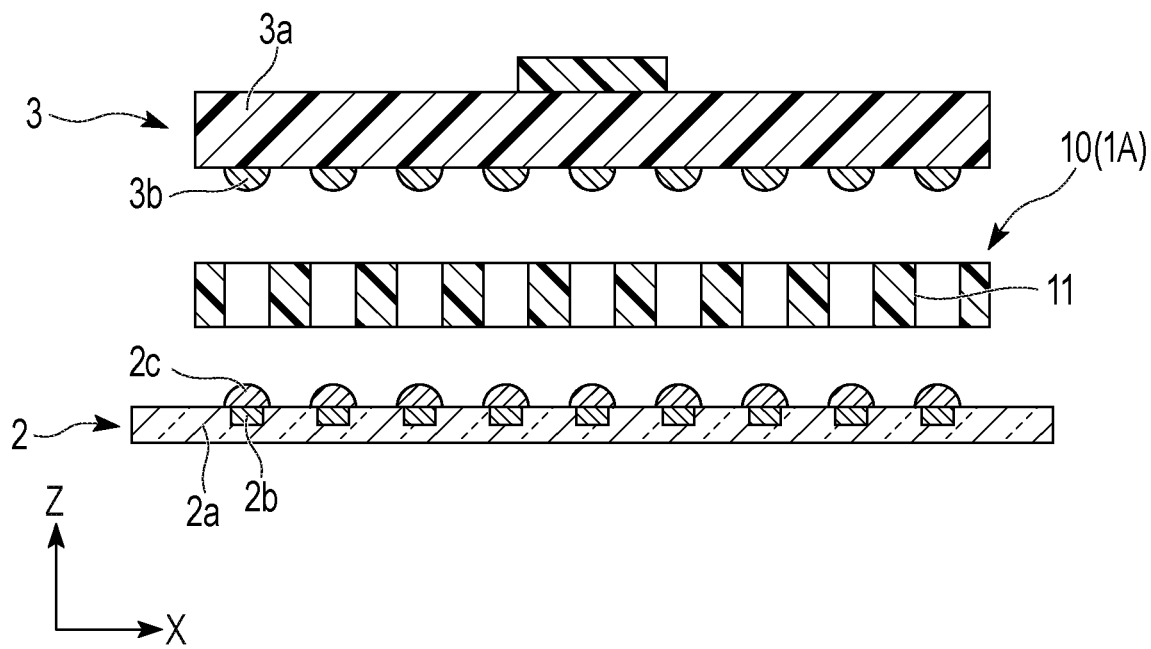
FIG. 3A is a diagram explaining the method of manufacturing the electronic board according to the first embodiment.
Figure 3B:
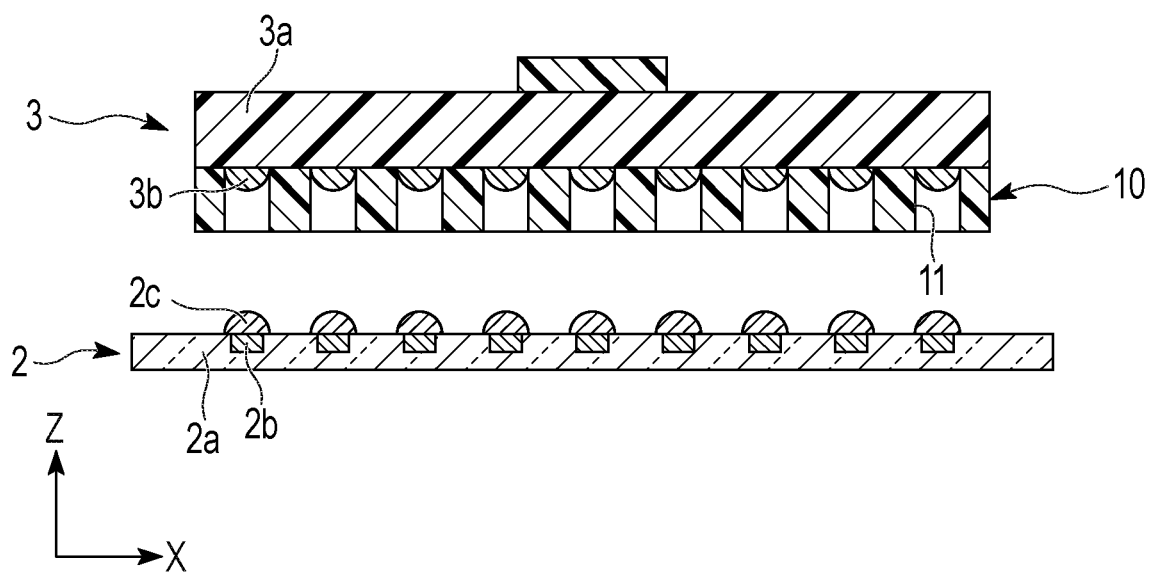
FIG. 3B is a diagram explaining a process following FIG. 3A.

The arrangement of the voids 11 can be appropriately changed, but it is preferable that the voids are arranged in accordance with the positions of the interfaces 3b of the first electronic component 3. For example, FIG. 3A illustrates the case where the first electronic component 3 is BGA (Ball Grid Array) and hemispherical solder balls (bumps) as the interfaces 3b are arranged on the bottom surface of the main body 3a side by side in a grid pattern. The diameter of the solder ball can be appropriately changed, but it is preferable that the diameter is around 100 to 1000 μm, for example. When the first electronic component 3 is BGA as illustrated in FIG. 3A, the arrangement of the voids 11 as illustrated in FIG. 2A can be employed.

Although it is not illustrated, the interfaces 3b of the first electronic component 3 may be lead frames (electrodes) that extend from the main body 3a in the horizontal direction X or in the front-back direction Y and then bend downward. In this case, the arrangement of the voids 11 in the resin layer 10 may be decided in accordance with the placement positions of the lead frames on the substrate 2. For example, the voids 11 may be intermittently arranged along the outer shape of the main body 3a of the first electronic component 3 in a planar view.

In addition, the first electronic component 3 may expose electrode terminals thereof on the bottom surface of the main body 3a without having solder balls and/or lead frames. In that case, the exposed electrode terminals of the first electronic component 3 act as the interfaces 3b, and the electrodes 2b of the substrate 2 and the electrode terminals of the first electronic component 3 are electrically connected to each other only by the substrate-side solder parts 2c.

As illustrated in FIG. 3A, in the state before the first electronic component 3 is mounted, a plurality of the substrate-side solder parts 2c is provided on the top surface of the substrate 2. The substrate-side solder parts 2c covers the electrodes 2b from above.

The substrate-side solder parts 2c include solder alloy. The materials of the substrate-side solder parts 2c can employ solder paste, for example. Particularly, when the interfaces 3b of the first electronic component 3 are solder balls, solder alloy, whose melting point is lower than that of the solder balls, is suitable as the materials of the substrate-side solder parts 2c. The substrate-side solder parts 2c may include a soldering accelerator such as flux.

A resin sheet etc. can be used as the cover films 20 and 30. The specific materials of the cover films 20 and 30 include PET (Polyethylene Terephthalate) and the like.

It is preferable that the melting point (T1 to be described later) of the solder alloy included in the substrate-side solder parts 2c is a low melting point not more than 150° C. for example. When employing solder alloy (low melting point solder) having a low melting point, a heating temperature in a reflow process to be described later can be suppressed to be low and thus an effect caused by a difference of a thermal expansion rate between the substrate 2, the first electronic component 3, and the solder alloy is reduced. Therefore, it is possible to suppress stress concentration on joint parts M during a cooling process after the reflow process. Solder alloy having a melting point not more than 150° C. includes Sn—Bi based solder alloy. The specific example of Sn—Bi based solder alloy includes a Sn—Bi solder alloy, a Sn—Bi—Cu solder alloy, a Sn—Bi—Ni solder alloy, a Sn—Bi—Cu—Ni solder alloy, a Sn—Bi—Ag solder alloy, and a Sn—Bi—Sb solder alloy. The substrate-side solder parts 2c may include one or two or more solder alloys as described above, or may include a solder alloy having another composition.

When adding Cu and Ni to the Sn—Bi solder alloy, it is desirable that it is "Cu: 0.1 to 1.0%" and it is "Ni: 0.01 to 0.1%". Moreover, in the alloy composition as described above, it is preferable that a Bi-contained amount is 30 to 80%. When the Bi-contained amount is within the above range, a melting point thereof can be made constant at 138° C. for example. By using an alloy having such the Bi-contained amount for the substrate-side solder parts 2c, in the reflow process to be described later, the joint parts M (also called solder joints, see FIG. 3D) can be formed while the interfaces 3b press the substrate-side solder parts 2c by its own weight of the first electronic component 3. Moreover, by further lowering the melting point of the solder alloy of the substrate-side solder parts 2c, it is possible to lower a heating temperature in the reflow process to further reduce thermal damage to the first electronic component 3 and the substrate 2. From the viewpoint of sufficiently lowering the melting point of the solder alloy of the substrate-side solder parts 2c, it is desirable that the Bi-contained amount is 35 to 70% and is further desirable that it is 53 to 61%.

In addition, when the interfaces 3b of the first electronic component 3 are solder balls, the materials of the solder balls can employ, for example, a Sn—Cu solder alloy, a Sn—Ag solder alloy, a Sn—Ag—Cu solder alloy, a Sn—Ag—Cu—Ni solder alloy, a Sn—Ag—Cu—Sb solder alloy, a Sn—Ag—Cu—Ni—Sb solder alloy, and the like. It is preferable that these solder alloys show a melting point not to melt during the reflow process to be described later, and these solder alloys may be high melting point solder whose melting point is not less than 200° C. for example.

The compositions of the solder alloy of the substrate-side solder parts 2c and the interfaces 3b as described above are an example, and thus can be appropriately changed. Moreover, the composition explained as the solder alloy of the substrate-side solder parts 2c may be used for the solder alloy of the interfaces 3b. Furthermore, both of the interfaces 3b and the substrate-side solder parts 2c may be formed with low melting point solder or both may be formed with high melting point solder. In addition, without providing solder on the first electronic component 3, the substrate-side solder parts 2c may be formed with low melting point solder or with high melting point solder.

Next, there will be explained the method of manufacturing the electronic board using the mounting sheet 1A configured as described above. The method of manufacturing the electronic board according to the present embodiment includes a substrate preparing process, a sheet preparing process, an attaching process, a superimposing process, and the reflow process. Hereinafter, each process will be specifically explained.

Substrate Preparing Process

The substrate preparing process is to prepare the substrate 2 in which the substrate-side solder parts 2c are provided on the electrodes 2b. A method of providing the substrate-side solder parts 2c on the substrate 2 can employ screen printing for example.

Sheet Preparing Process

The sheet preparing process is to prepare the mounting sheet 1A having the resin layer 10 in which the plurality of voids 11 are formed in accordance with the positions of the electrodes 2b. The mounting sheet 1A may include the cover films 20 and 30 as illustrated in FIG. 2B or may not include these cover films.

When the mounting sheet 1A includes the cover films 20 and 30, the present process is to previously remove the cover films 20 and 30 before the attaching process and to expose the top surface and the bottom surface of the resin layer 10.

Attaching Process

The attaching process is performed after the sheet preparing process. The attaching process is to attach the resin layer 10 to at least one of the first electronic component 3 and the substrate 2. In the example of FIG. 3A, the resin layer 10 is attached to the first electronic component 3. In this case, the position adjustment between the resin layer 10 and the first electronic component 3 is performed so that the interfaces 3b of the first electronic component 3 are located inside the voids 11 and then the resin layer 10 is attached to the main body 3a of the first electronic component 3. When the interfaces 3b are electrode terminals exposed on the bottom surface of the main body 3a of the first electronic component 3, at least a portion of each of the electrode terminals is surrounded by an upper opening of the corresponding void 11. The position adjustment may be performed by using image control etc. or may be performed by using positioning pins etc. When the resin layer 10 has an adherence property, the resin layer 10 and the first electronic component 3 adhere to each other by making the resin layer 10 have contact with the main body 3a. Therefore, the mismatch of relative positions between the voids 11 and the interfaces 3b can be suppressed in the following processes.

Moreover, in the attaching process, the resin layer 10 may be attached to the substrate 2. In this case, the position adjustment between the resin layer 10 and the substrate 2 is performed so that the substrate-side solder parts 2c are located inside the voids 11 and then the resin layer 10 is attached to the substrate body 2a. The position adjustment may be performed by using image control etc. or may be performed by using positioning pins etc. When the resin layer 10 has an adherence property, the resin layer 10 and the substrate 2 adhere to each other by making the resin layer 10 have contact with the substrate body 2a. Therefore, the mismatch of relative positions between the voids 11 and the substrate-side solder parts 2c can be suppressed in the following processes.

In addition, before attaching the resin layer 10 to the first electronic component 3 in the attaching process or before making the resin layer 10 attached to the substrate 2 have contact with the first electronic component 3 in the superimposing process, solder paste may be secondarily provided on the surfaces of the interfaces 3b of the first electronic component 3.

Superimposing Process

Figure 3C:
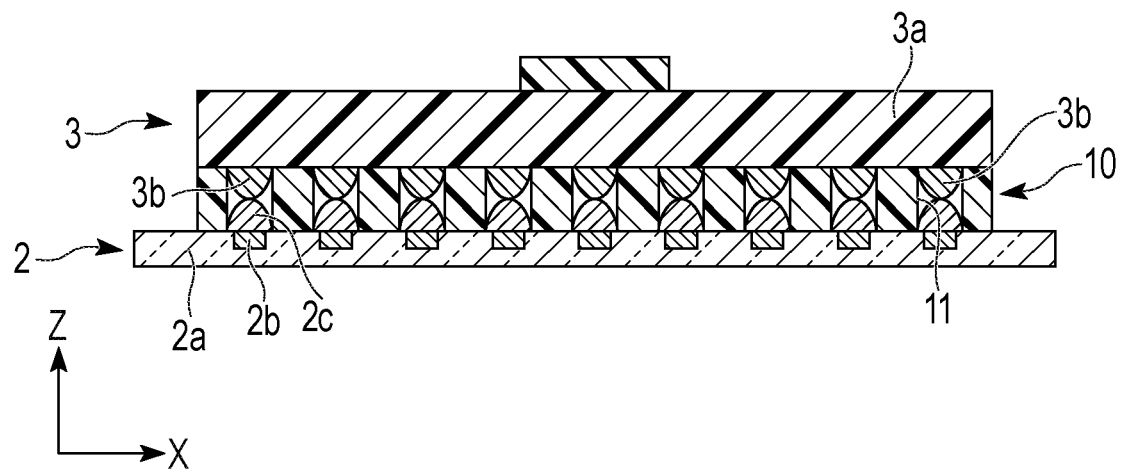
FIG. 3C is a diagram explaining a process following FIG. 3B.

The superimposing process is performed after the attaching process. As illustrated in FIG. 3C, the superimposing process is to sandwich the resin layer 10 between the first electronic component 3 and the substrate 2. At this time, the position adjustment between the first electronic component 3 and the substrate 2 is performed so that the interfaces 3b of the first electronic component 3 and the substrate-side solder parts 2c face each other at the positions of the respective voids 11. Herein, the state where "the interfaces 3b and the substrate-side solder parts 2c face each other at the positions of the respective voids 11" includes at least the following two cases. The first case indicates that the interfaces 3b and the substrate-side solder parts 2c face each other or are in contact with each other through the respective voids 11. The second case indicates that one of the interfaces 3b and the substrate-side solder parts 2c penetrates through the respective voids 11, and portions thereof protruding from the voids 11 and the other of the interfaces 3b and the substrate-side solder parts 2c face each other or are in contact with each other.

The position adjustment between the first electronic component 3 and the substrate 2 in the superimposing process may be performed by using image control etc. or may be performed by using positioning pins etc. When the interfaces 3b are solder balls, the solder balls have contact with the top surfaces of the substrate-side solder parts 2c. When the interfaces 3b are lead frames, the lead frames may have contact with the top surfaces of the substrate-side solder parts 2c or portions of the lead frames may be inserted into the substrate-side solder parts 2c. In addition, in FIG. 3C, the interfaces 3b of the first electronic component 3 and the substrate-side solder parts 2c have contact with each other inside the respective voids 11, but the present embodiment is not limited to this. If the interfaces 3b of the first electronic component 3 and the substrate-side solder parts 2c are to be joined in the reflow process to be described later, they may face each other or may not be in contact with each other in a state where one of the interfaces 3b and the substrate-side solder parts 2c is located outside the voids 11.

When the resin layer 10 has an adherence property, the first electronic component 3 and the substrate 2 adhere to each other by using the resin layer 10 after the superimposing process. Therefore, the mismatch of relative positions between the interfaces 3b and the substrate-side solder parts 2c can be suppressed in the following processes.

Reflow Process

Figure 3D:
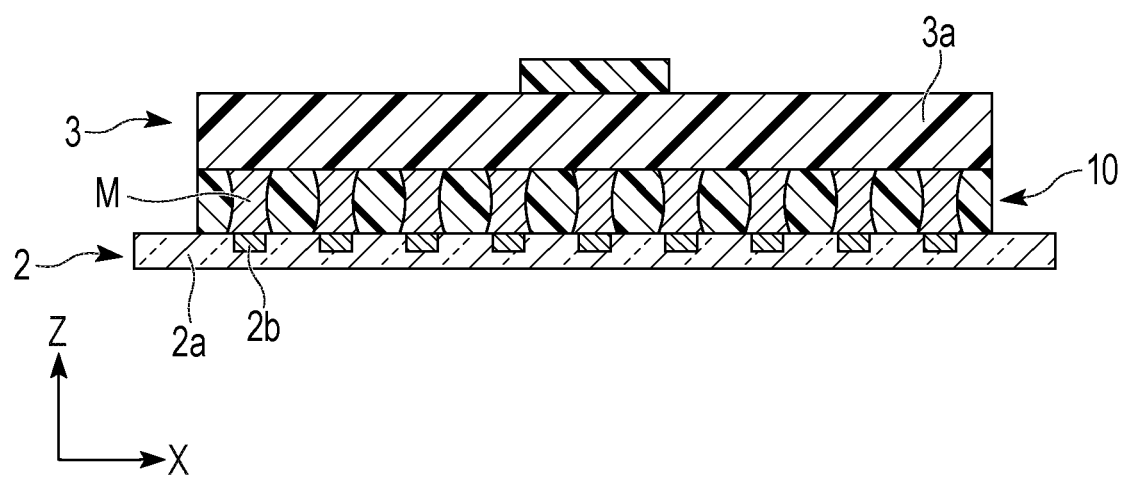
FIG. 3D is a diagram explaining a process following FIG. 3C.

The reflow process is performed after the superimposing process. In addition, before performing the reflow process, preliminary overheating of, e.g., about 50 to 100° C. may be performed to remove a solvent contained in the substrate-side solder parts 2c. In the reflow process, the substrate 2 is put in a reflow furnace to be heated in the state where the resin layer 10 is sandwiched between the first electronic component 3 and the substrate 2. As a result, as illustrated in FIG. 3D, the joint parts M (solder joints) between the interfaces 3b and the substrate-side solder parts 2c are formed by melting the substrate-side solder parts 2c. In the present specification, the maximum temperature in the reflow process is represented with "Tr". For example, "Tr" is 150 to 180° C. Moreover, the shapes of the interfaces 3b are changed in FIG. 3D, but the shapes of the interfaces 3b may not be changed when the interfaces 3b are lead frames or electrode terminals exposed on the bottom surface of the main body 3a.

In addition, the mounting process of the first electronic component 3 is illustrated in FIGS. 3A to 3D, but it is sufficient that the same attaching process and superimposing process are also performed on the second electronic component 4 and the reflow process is performed on the second electronic component simultaneously with the first electronic component 3.

Moreover, in the reflow process, the resin layer 10 is also heated and thus has flowability to some extent. For this reason, the shape of the resin layer 10 is also changed to surround the joint parts M.

By performing the cooling process after the reflow process, the joint parts M and the resin layer 10 are cured to stabilize the respective shapes. At this time, because the resin layer 10 acts as underfill, the first electronic component 3 and the substrate 2 are adhesively fixed by the resin layer 10 to obtain the electronic board S.

As described above, the method of manufacturing the electronic board according to the present embodiment includes: the substrate preparing process of preparing the substrate 2 in which the substrate-side solder parts 2c are provided on the electrodes 2b; the sheet preparing process of preparing the mounting sheet 1A having the resin layer 10 in which the plurality of voids 11 is formed in accordance with the positions of the electrodes 2b; the attaching process of attaching the resin layer 10 to at least one of the first electronic component 3 and the substrate 2 so that the interfaces 3b of the first electronic component 3 or the substrate-side solder parts 2c are located inside the voids 11; the superimposing process of making the interfaces 3b and the substrate-side solder parts 2c face each other at the positions of the voids 11; and the reflow process of melting the substrate-side solder parts 2c by heating to join the interfaces 3b and the electrodes 2b.

Then, the reflow process joins the substrate-side solder parts 2c and the interfaces 3b of the first electronic component 3 to form the joint parts M and bonds the main body 3a of the first electronic component 3 to the substrate 2 by using the resin layer 10. Therefore, it is not necessary to form the joint parts M and the underfill in separate processes, and the electronic board S having the raised joint strength between the electronic component 3 and the substrate 2 can be more efficiently manufactured.

Moreover, if the present embodiment is employed, the joint parts M can be covered without a gap and thus the joint parts M can be surely reinforced by optimizing the thickness of the resin layer 10 of the mounting sheet 1A and the amount of solder of the substrate-side solder parts 2c.

Moreover, the mounting sheet 1A according to the present embodiment includes the resin layer 10 in which the plurality of voids 11 is formed in accordance with the positions of the electrodes 2b of the substrate 2 to be mounted, and the voids 11 penetrate through the resin layer 10 in the vertical direction Z. The method of manufacturing the electronic board as described above can be executed by using the mounting sheet 1A.

Furthermore, the mounting sheet 1A may include the first cover film 20 that covers the top surface of the resin layer 10 and the second cover film 30 that covers the bottom surface of the resin layer 10. By this configuration, even if the resin layer 10 has an adherence property, the mounting sheet 1A can be easily distributed and stored.

Second Embodiment

Next, the second embodiment according to the present invention will be explained, but the basic configuration of the second embodiment is similar to that of the first embodiment. For this reason, the same components have the same reference numbers and their explanations are omitted, and an explanation is provided about only different points.

The present embodiment is different from the first embodiment in terms of including a preliminary mounting process to be explained later.

Preliminary Mounting Process

Figure 4A:
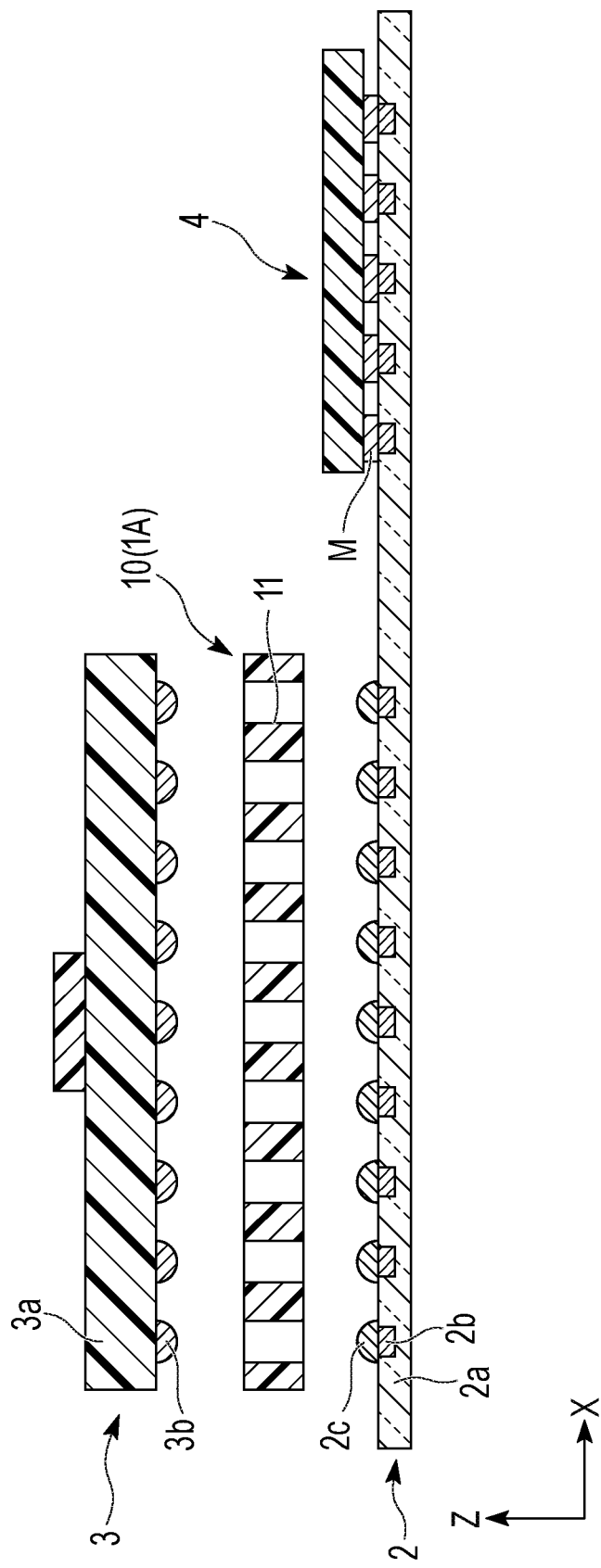
FIG. 4A is a diagram explaining a method of manufacturing an electronic board according to a second embodiment.
Figure 4B:
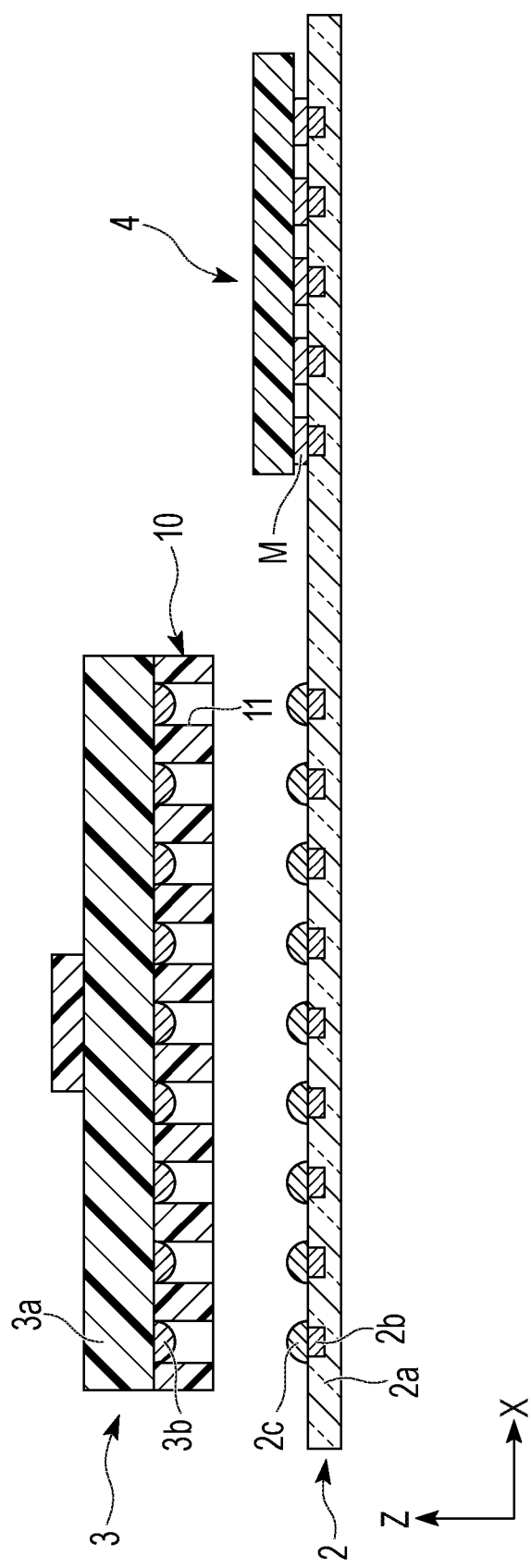
FIG. 4B is a diagram explaining a process following FIG. 4A.
Figure 4C:
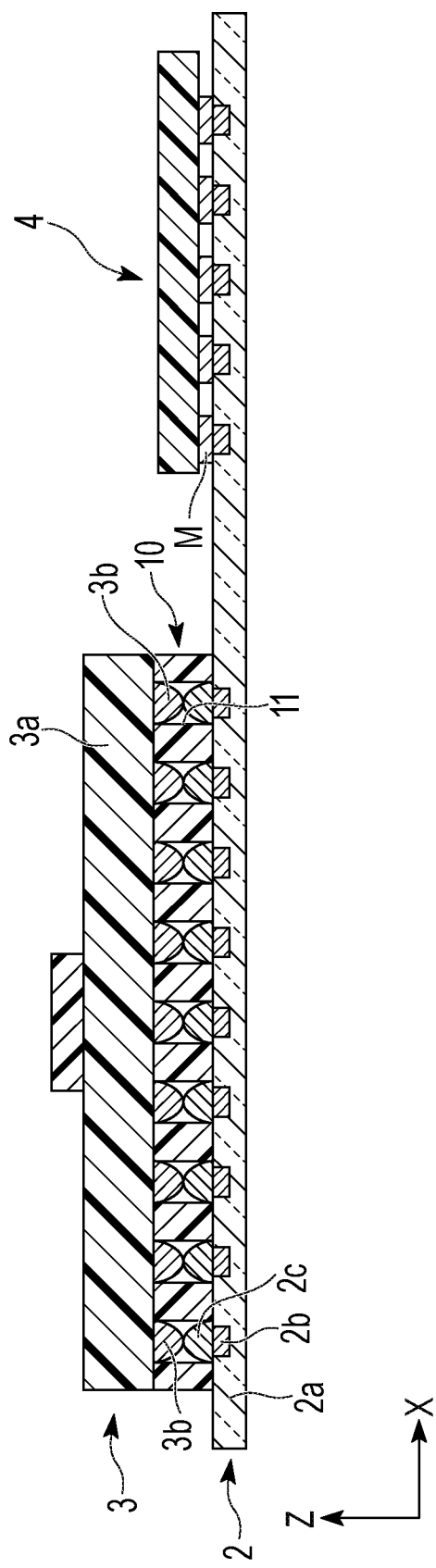
FIG. 4C is a diagram explaining a process following FIG. 4B.
Figure 4D:
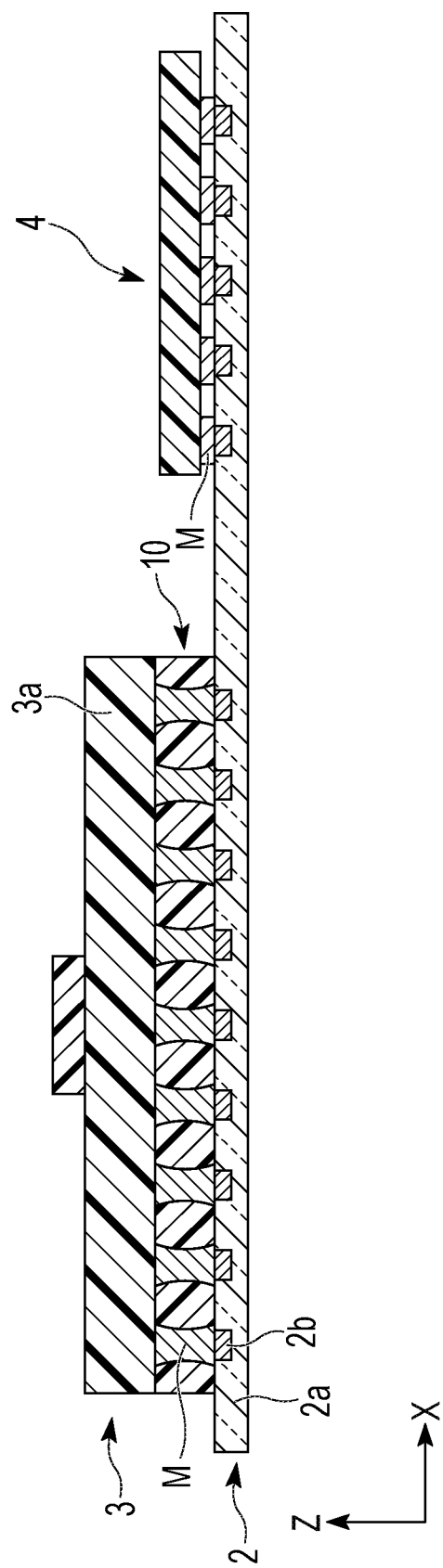
FIG. 4D is a diagram explaining a process following FIG. 4C.

The preliminary mounting process is to previously mount the second electronic component 4 on the substrate 2 before mounting the first electronic component 3 on the substrate 2. As illustrated in FIG. 4A, the second electronic component 4 is electrically connected to the electrodes 2b of the substrate 2 by joint parts M (solder joints). In the preliminary mounting process, it is preferable that the second electronic component 4 is mounted on the substrate 2 with reflow soldering. Moreover, a method of mounting the second electronic component 4 on the substrate 2 with reflow soldering may use the method described in the above first embodiment or may use the existing method of applying and reflowing solder paste onto the electrodes 2b of the substrate 2.

In the present embodiment, as illustrated in FIGS. 4A to 4D, the processes for mounting the first electronic component 3 are performed in the state where the second electronic component 4 is previously mounted on the substrate 2.

The substrate preparing process, the sheet preparing process, the attaching process, the superimposing process, and the reflow process for mounting the first electronic component 3 are the same as those of the first embodiment.

The present embodiment is preferable when the first electronic component 3 is relatively expensive or is comparatively difficult to be obtained and the second electronic component 4 is relatively inexpensive or is comparatively easy to be obtained, for example. The reason is that relatively-inexpensive or comparatively-easily-obtainable the second electronic component 4 is previously mounted on the substrate 2 and then the first electronic component 3 can be mounted in accordance with the demand of the electronic board S. Moreover, the present embodiment is also preferable when it is unnecessary to provide underfill between the second electronic component 4 and the substrate 2 and/or when the reliability of this underfill may be lower than the reliability of the underfill between the first electronic component 3 and the substrate 2.

In the present embodiment, assuming that the melting point of solder alloy of the substrate-side solder parts 2c is "T1" and the melting point of solder alloy used for the reflow soldering of the second electronic component 4 is "T2", it is preferable that "T2" is higher than "T1" (T2>T1). For example, when the low melting point solder alloy whose "T1" as explained in the first embodiment is not more than 150° C. is used for the substrate-side solder parts 2c, it is preferable that "T2" is around 180° C. By selecting a solder alloy whose melting point is higher than "T1" as a solder alloy used for the reflow soldering of the second electronic component 4, the joint parts M (solder joints) of the second electronic component 4 can be prevented from being remelted in the reflow process.

Furthermore, in that case, it is desirable that the maximum temperature Tr in the reflow process satisfies the relationship of "T1<Tr<T2" and is a temperature at which the joint parts M of the second electronic component 4 are not melted during the reflow process. If "Tr" is within this temperature region, it can be suppressed that the solder joint of the second electronic component 4 becomes unstable during the reflow process.

In addition, when the maximum temperature in the reflow process (hereinafter, called "preliminary reflow process") included in the preliminary mounting process is represented by "Tp", "Tp" is not less than "T2" and, for example, "Tp" is not less than 190° C. In summary, it is preferable that it is "T1<Tr<T2<Tp".

As described above, the method of manufacturing the electronic board according to the present embodiment includes previously mounting the second electronic component 4 on the substrate 2 by reflow soldering. It is preferable that the melting point T2 of solder alloy that joins the second electronic component 4 and the substrate 2 is higher than the melting point T1 of solder alloy of the substrate-side solder parts 2c. By this configuration, as described above, even if the first electronic component 3 and the second electronic component 4 are mounted on the substrate in separate processes, it is possible to secure the reliability of the electronic board S.

Moreover, according to the present embodiment, there is obtained the electronic board S that includes: the substrate 2; the first electronic component 3 mounted on the substrate 2 with reflow soldering; the second electronic component 4 mounted on the substrate 2 with reflow soldering; and the underfill filled up at least between the first electronic component 3 and the substrate 2. Moreover, there is obtained the electronic board S in which it is suppressed that the joint parts M (solder joints) of the second electronic component 4 are re-melted in the reflow process as described above because the melting point T2 of solder alloy that joins the second electronic component 4 and the substrate 2 is higher than the melting point T1 of solder alloy that joins the first electronic component 3 and the substrate 2.

Third Embodiment

Next, the third embodiment according to the present invention will be explained, but the basic configuration of the third embodiment is similar to that of the first embodiment. For this reason, the same components have the same reference numbers and their explanations are omitted, and an explanation is provided about only different points.

The present embodiment is different from the first embodiment in that the resin layers 10 are attached to both of the substrate 2 and the first electronic component 3.

Figure 5A:
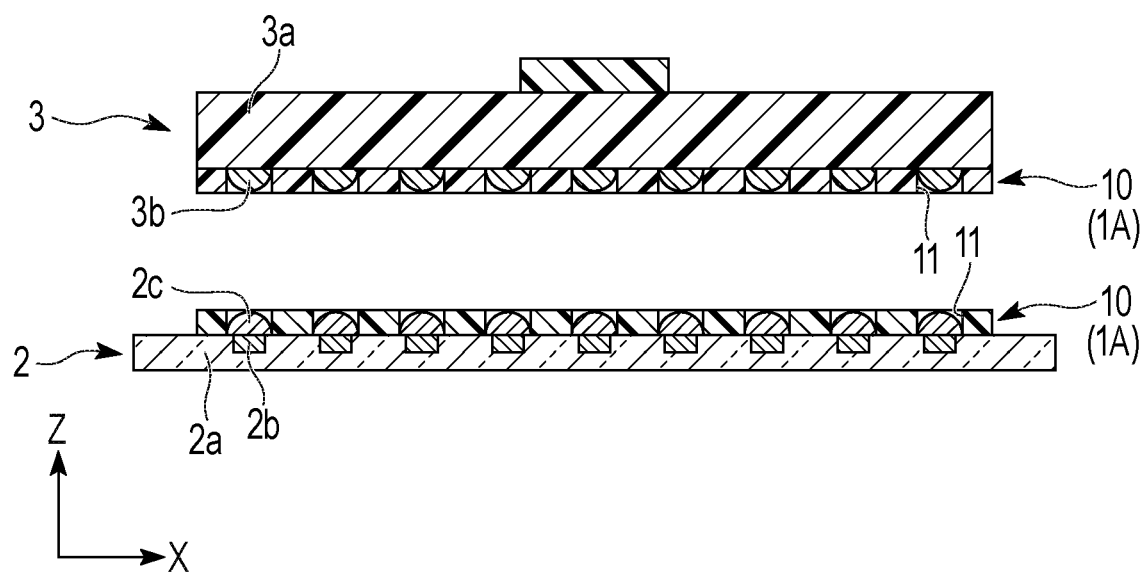
FIG. 5A is a diagram explaining a method of manufacturing an electronic board according to a third embodiment.

In the present embodiment, the sheet preparing process is to prepare at least the two mounting sheets 1A. Then, as illustrated in FIG. 5A, the attaching process is to attach the resin layers 10 to both of the first electronic component 3 and the substrate 2.

Figure 5B:
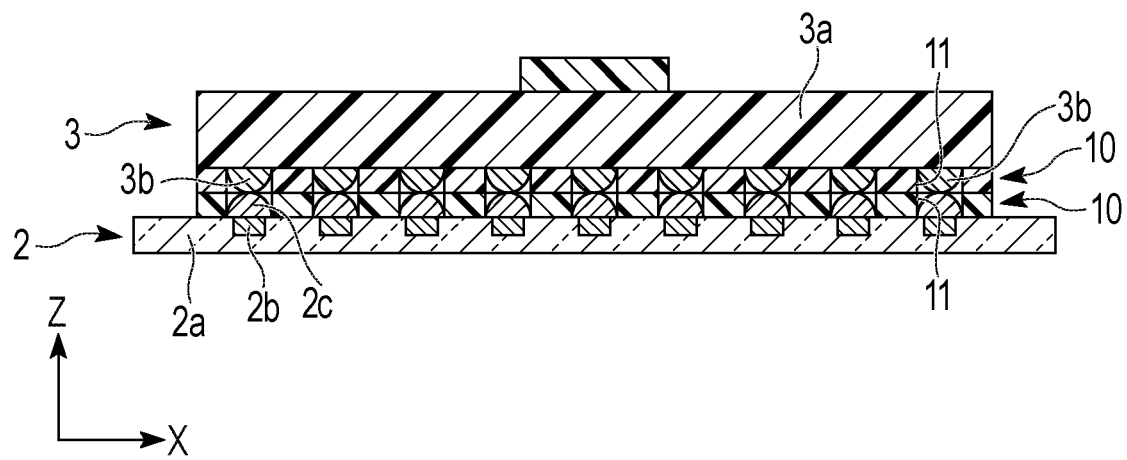
FIG. 5B is a diagram explaining a process following FIG. 5A.

As illustrated in FIG. 5B, the superimposing process is to sandwich the two resin layers 10 between the first electronic component 3 and the substrate 2. At this time, the position adjustment between the first electronic component 3 and the substrate 2 is performed so that the interfaces 3b of the first electronic component 3 and the substrate-side solder parts 2c face each other at the positions of the voids 11 (through the two voids 11). The other points are similar to the first embodiment. For example, at the time of the superimposing process, the interfaces 3b and the substrate-side solder parts 2c may not have contact with each other.

In the present embodiment, by making at least one of the two resin layers 10 have an adherence property, the two resin layers 10 can be bonded to each other in the superimposing process.

The electronic board S can be obtained by performing the same reflow process as that of the first embodiment after the superimposing process. In addition, the two resin layers 10 are also softened in the reflow process, and the two resin layers 10 become unified in the subsequent cooling process. In the present embodiment, the resin layer 10 attached to the first electronic component 3 corresponds to the upper portion of the underfill, and the resin layer 10 attached to the substrate 2 corresponds to the lower portion of the underfill.

According to the configuration of the present embodiment, the upper and lower portions of the underfill can easily have different materials by making the two resin layers 10 have materials different from each other for example.

Fourth Embodiment

Next, the fourth embodiment according to the present invention will be explained, but the basic configuration of the fourth embodiment is similar to that of the first embodiment. For this reason, the same components have the same reference numbers and their explanations are omitted, and an explanation is provided about only different points.

Figure 6A:
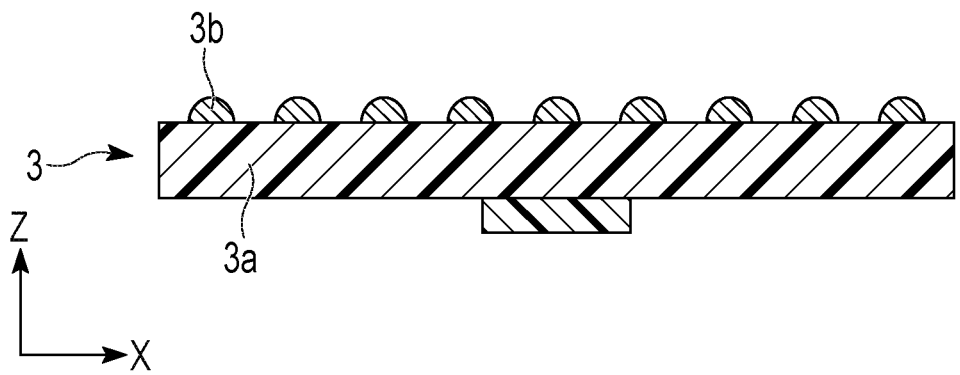
FIG. 6A is a diagram explaining a method of manufacturing an electronic board according to a fourth embodiment.

In the present embodiment, the first electronic component 3 is prepared as illustrated in FIG. 6A. It is preferable that the interfaces 3b of the first electronic component 3 protrude from the main body 3a in the vertical direction. For example, it is preferable that the interfaces are solder balls or lead frames.

Figure 6B:
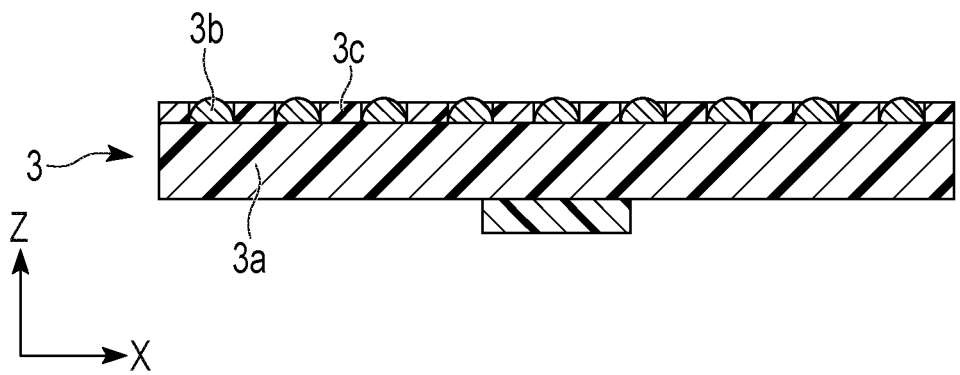
FIG. 6B is a diagram explaining a process following FIG. 6A.

Next, as illustrated in FIG. 6B, a component-side resin layer 3c is provided on the bottom surface (surface on which the interfaces 3b are provided) of the main body 3a of the first electronic component 3. The thickness of the component-side resin layer 3c is smaller than the vertical-direction dimension of the interfaces 3b. For this reason, a portion of each of the interfaces 3b is exposed from the component-side resin layer 3c.

In the electronic board S, the component-side resin layer 3c corresponds to the upper portion of the underfill of the first electronic component 3. A method of providing the component-side resin layer 3c includes, for example, a method of applying uncured resin materials on the bottom surface of the first electronic component 3 and then curing the resin materials (performing pre-curing). When applying uncured resin materials, it is good that the first electronic component 3 is turned upside down as illustrated in FIGS. 6A and 6B.

The material of the component-side resin layer 3c may be the same as or different from that of the resin layer 10 of the mounting sheet 1A. Specifically, the component-side resin layer 3c can use resin materials (composite resin) that include epoxy resin, acrylic resin, silicon resin, and the like. In order to improve various resistances such as durability and heat resistance, a filler such as glass may be added to the resin materials of the component-side resin layer 3c. The component-side resin layer 3c may have an adherence property. In this regard, however, the specific material, composition, and property of the component-side resin layer 3c are not limited to the above, and thus can be appropriately changed.

Figure 6C:
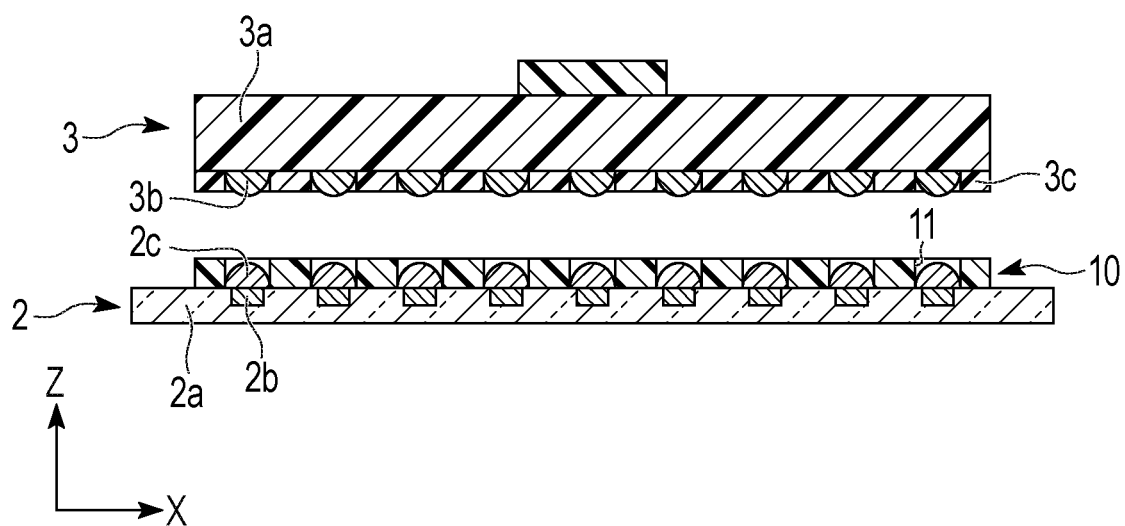
FIG. 6C is a diagram explaining a process following FIG. 6B.

In the present embodiment, the resin layer 10 is attached to the substrate 2 in the attaching process. The details at this time are as described in the first embodiment. Moreover, in the present embodiment, as illustrated in FIG. 6C, the component-side resin layer 3c and the resin layer 10 of the mounting sheet 1A are caused to face each other in the vertical direction. In the superimposing process, the resin layer 10 and the component-side resin layer 3c are sandwiched between the first electronic component 3 and the substrate 2. At this time, the position adjustment between the first electronic component 3 and the substrate 2 is performed so that the interfaces 3b exposed from the component-side resin layer 3c and the substrate-side solder parts 2c face each other at the positions of the respective voids 11 of the resin layer 10 (through the voids 11). The other points are similar to the first embodiment. For example, at the time of the superimposing process, the interfaces 3b and the substrate-side solder parts 2c may not have contact with each other.

In the present embodiment, because at least one of the resin layer 10 and the component-side resin layer 3c has an adherence property, the resin layer 10 and the component-side resin layer 3c can be bonded to each other in the superimposing process.

The electronic board S can be obtained by performing the same reflow process as that of the first embodiment after the superimposing process. In addition, the component-side resin layer 3c and the resin layer 10 are softened in the reflow process, and the resin layer 10 and the component-side resin layer 3c become unified in the subsequent cooling process. In the present embodiment, the component-side resin layer 3c corresponds to the upper portion of the underfill, and the resin layer 10 corresponds to the lower portion of the underfill.

As described above, in the present embodiment, the resin layer 10 is attached to the substrate 2 in the attaching process. Then, the present embodiment includes a process of providing the component-side resin layer 3c on the first electronic component 3 so that the interfaces 3b are exposed through the component-side resin layer 3c. According to this configuration, the upper and lower portions of the underfill can easily have different materials by making the materials of the component-side resin layer 3c and the resin layer 10 be different from each other for example.

Fifth Embodiment

Next, the fifth embodiment according to the present invention will be explained, but the basic configuration of the fifth embodiment is similar to that of the first embodiment. For this reason, the same components have the same reference numbers and their explanations are omitted, and an explanation is provided about only different points.

Figure 7A:
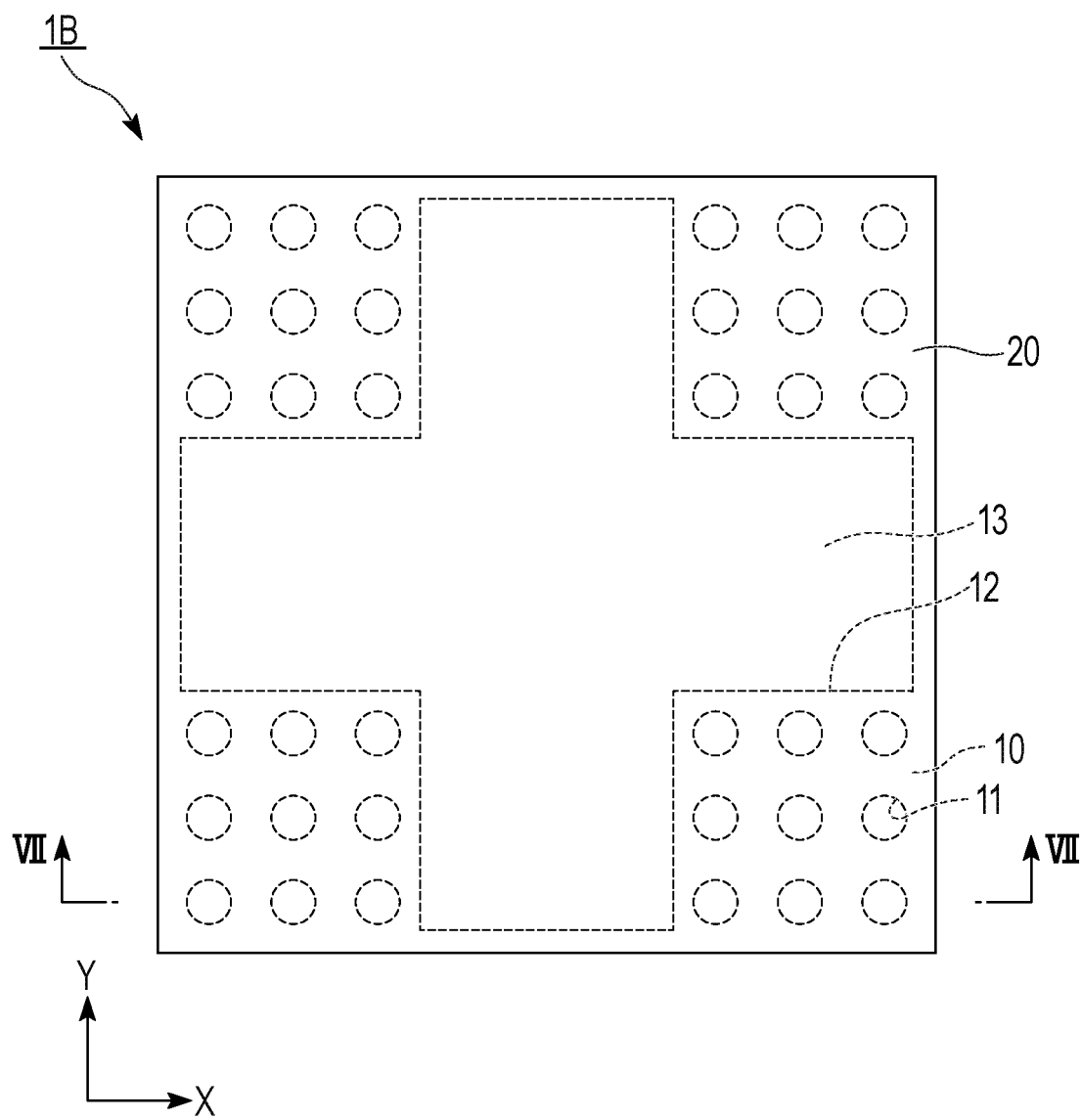
FIG. 7A is a plan view illustrating a mounting sheet according to a fifth embodiment.
Figure 7B:
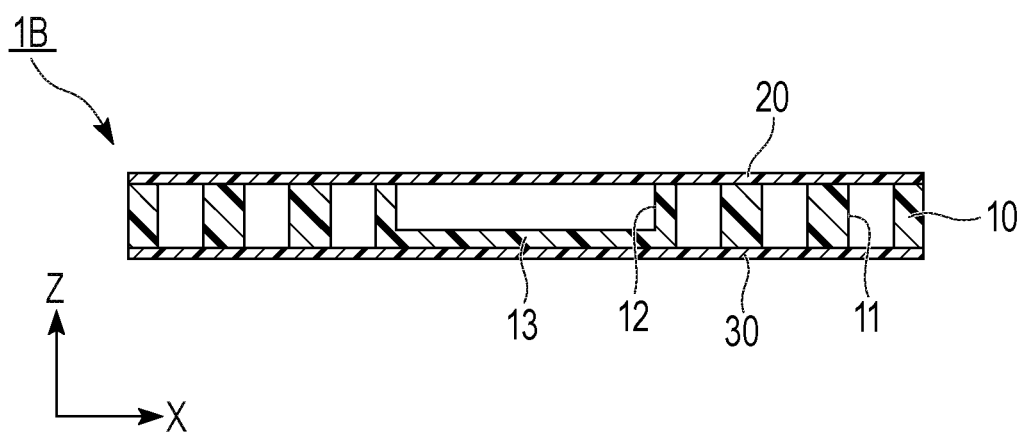
FIG. 7B is a cross-sectional diagram taken along VII-VII arrows in FIG. 7A.

As illustrated in FIGS. 7A and 7B, a mounting sheet 1B according to the present embodiment includes a gap 12 and a connection part 13 that are formed in the resin layer 10. The gap 12 is a concave portion recessed downward from the top surface of the resin layer 10 and is formed in a cross shape in a planar view. The connection part 13 is provided below the gap 12. In other words, the connection part 13 blocks up the gap 12 from below.

The mounting sheet 1B according to the present embodiment can be also used similarly to the mounting sheet 1A according to the first to fourth embodiments. Moreover, when using the mounting sheet 1B, selectively providing underfill in the corners of the main body 3a of the electronic component 3 (so-called performing corner bond) can be realized with a simple manufacturing method.

The first to fourth embodiments are common in that the resin layer 10 has a shape configured to cover at least the positions on the substrate 2 corresponding to the four corners of the first electronic component 3 in a planar view.

In this regard, however, the fifth embodiment is different from the first and fourth embodiments in that the resin layer 10 provides the gap 12 in a portion other than the positions on the substrate 2 corresponding to the four corners of the first electronic component 3 in a planar view.

In FIG. 7A, substantially square-shaped areas (portions excluding the gap 12) are provided in the four corners of the resin layer 10. However, the shape of the areas provided in the four corners can be appropriately changed. For example, the shape may be a triangle shape etc. In this case, the gap 12 may not be a cross shape in a planar view.

In addition, the technical scope of the present invention is not limited to the embodiments and various modifications may be made without departing from the spirit or scope of the general inventive concept.

For example, in the fifth embodiment, corner bond is performed on the first electronic component 3 by forming the gap 12 in the one mounting sheet 1B. However, corner bond may be performed by using the four mounting sheets 1A whose area is smaller than that of the main body 3a of the first electronic component 3. In this case, the sheet preparing process includes preparing the four mounting sheets 1A whose area in a planar view is smaller than that of the main body 3a. Then, the attaching process includes attaching the resin layers 10 of the four mounting sheets 1A at the positions corresponding to the four corners of the first electronic component 3 to at least one of the first electronic component 3 and the substrate 2.

Figure 8A:
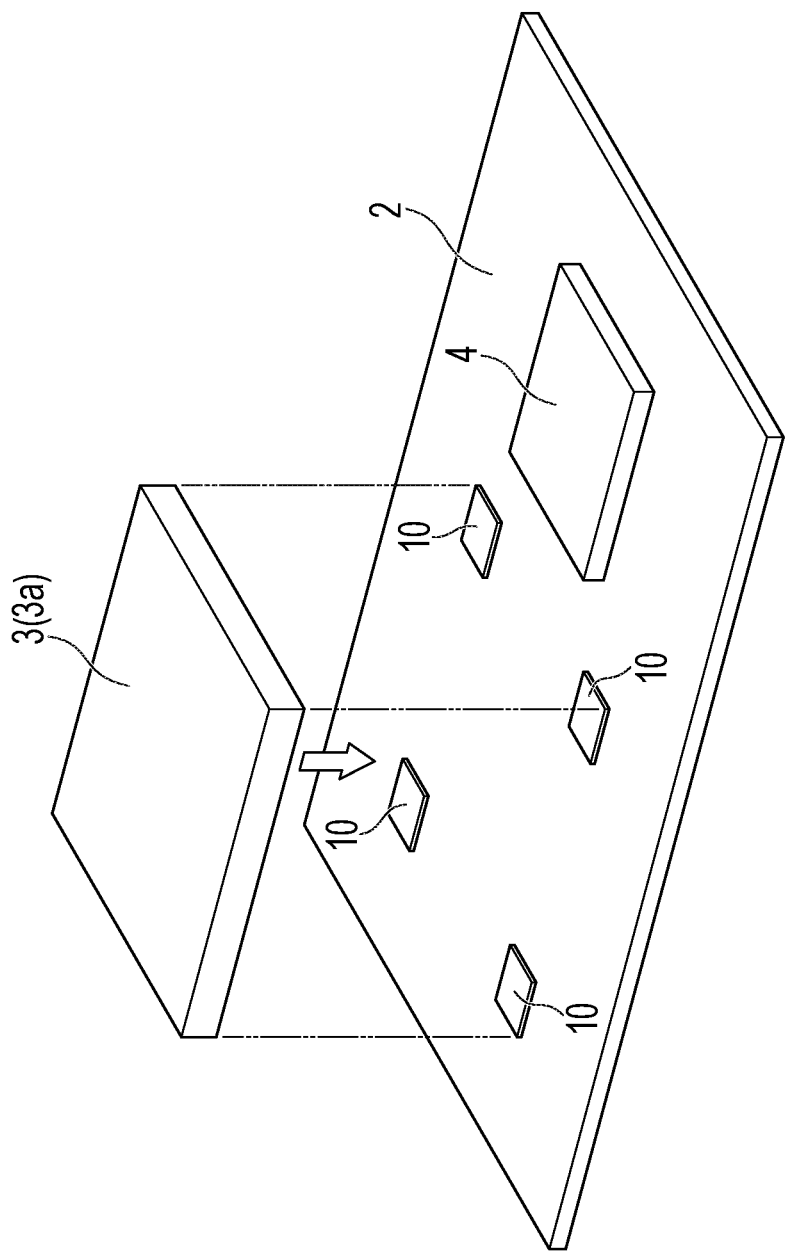
FIG. 8A is a diagram explaining a method of manufacturing an electronic board according to a first modified example of the first embodiment.

In the attaching process, the state as illustrated in FIG. 8A is obtained when attaching the resin layers 10 of the four mounting sheets 1A to the substrate 2. Then, in the superimposing process, the four corners of the first electronic component 3 are respectively placed on the resin layers 10.

On the other hand, in the attaching process, the resin layers 10 of the four mounting sheets 1A may be attached to the four corners of the first electronic component 3. Moreover, by applying the third embodiment, the resin layers 10 may be provided on both of the four corners of the first electronic component 3 and the positions on the substrate 2 corresponding to the corners.

Figure 8B:
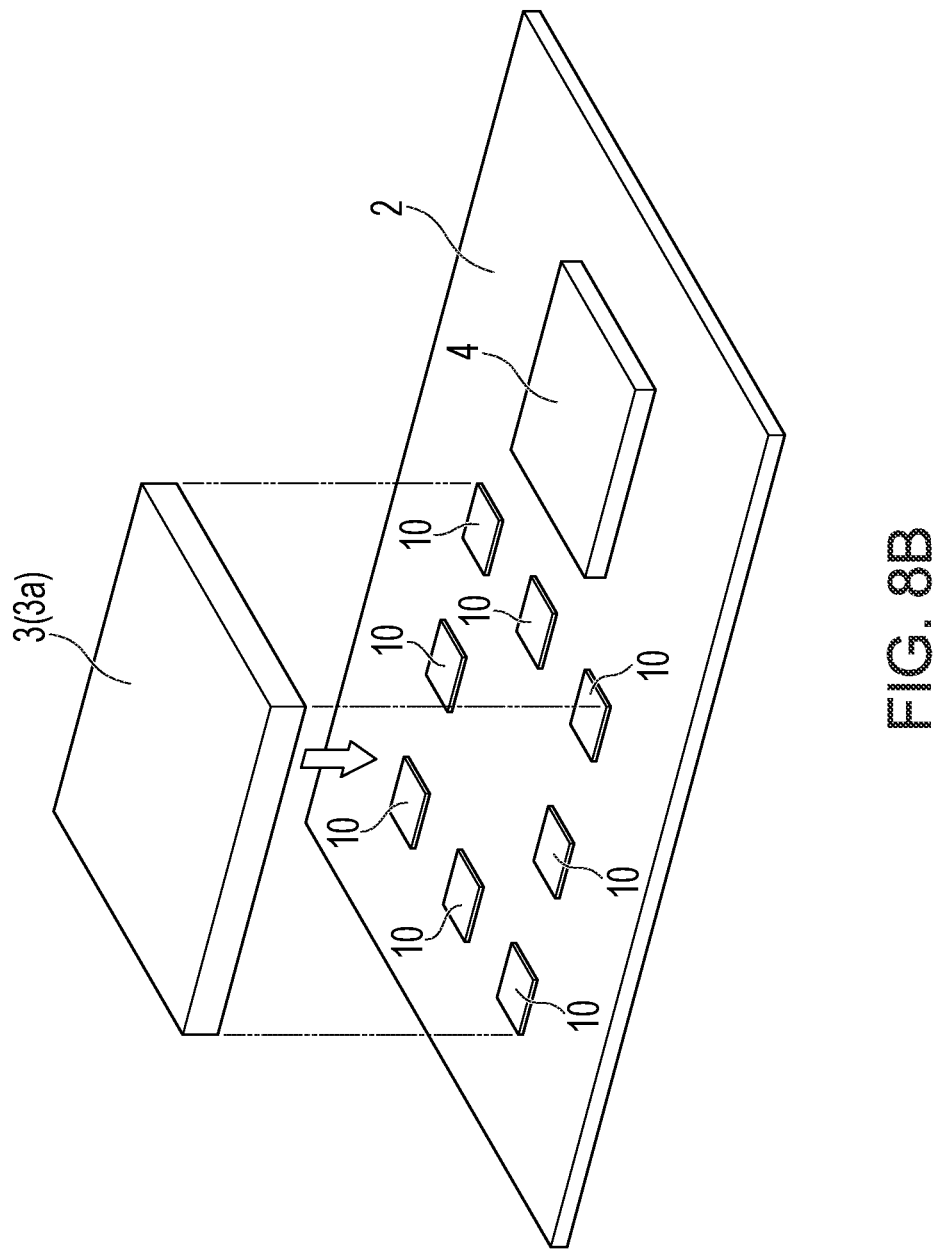
FIG. 8B is a diagram explaining a method of manufacturing an electronic board according to a second modified example of the first embodiment.

Moreover, as illustrated in FIG. 8B, the resin layer may be placed at the position corresponding to the vicinity of the center of each of four sides in addition to the corners of the first electronic component 3. In this case, the filling places of the resin layers 10 using the mounting sheets 1A are eight places.

In addition, in FIG. 8B, the resin layers 10 are arranged at the positions corresponding to the central portions of all sides of the first electronic component 3, but the resin layers 10 may be arranged at only the positions corresponding to the central portions of some of the four sides. Moreover, a plurality of the resin layers 10 may be arranged side by side at the positions corresponding to one side of the first electronic component 3. That is to say, the number of the resin layers 10 is not limited to four (FIG. 8A) or eight (FIG. 8B), and may be five to seven or nine or more.

That is to say, the present embodiment may include preparing the mounting sheets 1A to have at least the four independent resin layers 10 and attaching the resin layers 10 at the respective positions corresponding to the four corners of the first electronic component 3 to at least one of the first electronic component 3 and the substrate 2. Even with this method, corner bond can be performed on the first electronic component 3.

Moreover, by applying the fourth embodiment, the component-side resin layers 3c may be provided on the four corners of the first electronic component 3.

Figure 8C:
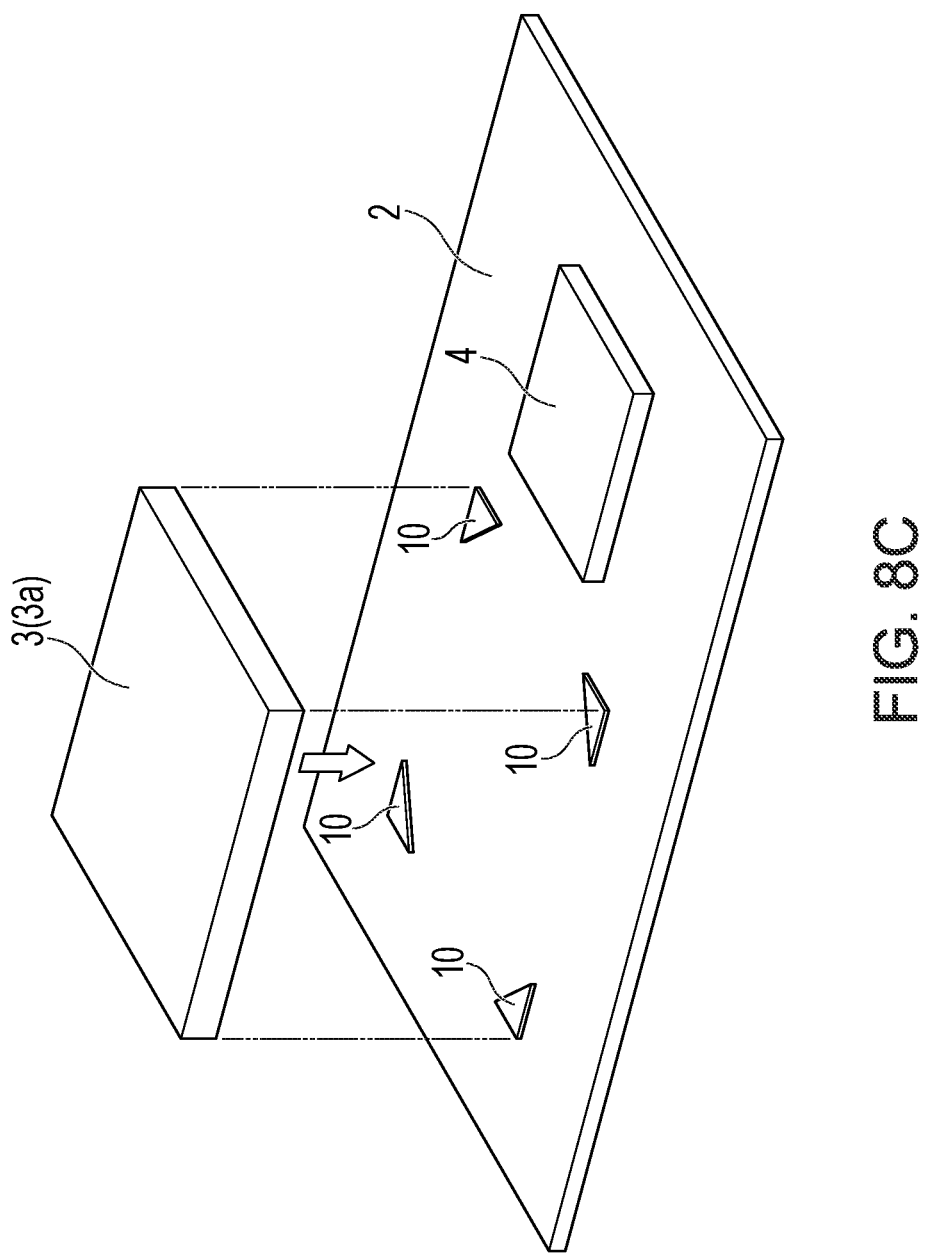
FIG. 8C is a diagram explaining a method of manufacturing an electronic board according to a third modified example of the first embodiment.

Moreover, the shape of the resin layers 10 may be appropriately changed. For example, as illustrated in FIG. 8C, the resin layers 10 having a triangle shape may be arranged at the positions corresponding to the four corners of the first electronic component 3. Furthermore, the resin layers 10 may have a quadrangle or a shape other than a triangle.

In addition, without departing from the spirit or scope of the general inventive concept, the components in the above-described embodiments can be appropriately replaced by well-known components and the above-described embodiments and modified examples may be appropriately combined.

For example, a method of manufacturing the electronic board including the preliminary mounting process and the process of attaching the two resin layers 10 to both of the first electronic component 3 and the substrate 2 may be employed by the combination of the second and third embodiments.

Moreover, a method of manufacturing the electronic board including the preliminary mounting process and the process of providing the component-side resin layer 3c on the first electronic component 3 may be employed by the combination of the second and fourth embodiments.

In addition to the above, the first to fifth embodiments and the configurations of FIGS. 8A to 8C can be appropriately combined.

The invention claimed is:

1. A method of manufacturing the electronic board, the method comprising:
    preparing a substrate in which solder parts are on electrodes of the substrate;
    preparing a mounting sheet having a resin layer in which a plurality of voids coincide with positions of the electrodes;
    attaching the resin layer to at least one of a first electronic component and the substrate so that interfaces of the first electronic component or the solder parts are located inside the respective voids;
    causing the interfaces and the solder parts to face each other at positions of respective voids; and
    melting the solder parts by heating to join the interfaces and the electrodes, wherein:
    the resin layer has a shape configured to cover positions on the substrate corresponding to at least four corners of the first electronic component in a planar view,
    the preparing includes preparing the mounting sheet to have at least four independent resin layers, and
    the attaching includes attaching the resin layers at positions corresponding to the four corners of the first electronic component to at least one of the first electronic component and the substrate.

2. The method of manufacturing the electronic board according to claim 1, wherein:
    a second electronic component is mounted on the substrate, before attaching the resin layer to the substrate, by reflow soldering, and
    a melting point T2 of a solder alloy that joins the second electronic component and the substrate is higher than a melting point T1 of a solder alloy of the solder parts.

3. The method of manufacturing the electronic board according to claim 2, wherein a maximum temperature Tr at which the solder parts are melted is higher than T1 and is lower than T2.

4. The method of manufacturing the electronic board according to claim 1, wherein:
    at least two mounting sheets are prepared, and resin layers of at least the two mounting sheets are attached to both of the first electronic component and the substrate.

5. The method of manufacturing the electronic board according to claim 1, wherein:
    the resin layer is attached to the substrate, and
    the method further comprises providing a component-side resin layer on the first electronic component so that the interfaces are exposed through the component-side resin layer.

6. The method of manufacturing the electronic board according to claim 1, wherein the resin layer has a shape configured to cover positions on the substrate corresponding to at least four corners of the first electronic component in a planar view.

* * * * *